United States Patent [19]
Koutny, Jr.

[11] Patent Number: 6,143,663
[45] Date of Patent: Nov. 7, 2000

[54] EMPLOYING DEIONIZED WATER AND AN ABRASIVE SURFACE TO POLISH A SEMICONDUCTOR TOPOGRAPHY

[75] Inventor: William W. C. Koutny, Jr., Santa Clara, Calif.

[73] Assignee: Cypress Semiconductor Corporation, San Jose, Calif.

[21] Appl. No.: 09/012,089

[22] Filed: Jan. 22, 1998

[51] Int. Cl.$^7$ ................................................. H01L 21/302
[52] U.S. Cl. ........................ 438/691; 438/692; 438/693
[58] Field of Search ................................. 438/690, 691, 438/692, 747, 748; 451/41; 156/645, 636.1

[56] References Cited

U.S. PATENT DOCUMENTS

| | | | |
|---|---|---|---|
| 3,629,023 | 12/1971 | Stehlow | 156/17 |
| 3,979,239 | 9/1976 | Walsh | 156/4 |
| 4,256,535 | 3/1981 | Banks | 156/645 |
| 4,261,791 | 4/1981 | Shwartzman | 156/628 |
| 4,373,991 | 2/1983 | Banks | 156/645 |
| 4,505,720 | 3/1985 | Gabor et al. | 51/295 |
| 4,600,469 | 7/1986 | Fusco et al. | 156/636 |
| 4,677,043 | 6/1987 | Cordes, III et al. | 430/224 |
| 4,768,883 | 9/1988 | Waldo et al. | 356/399 |

(List continued on next page.)

FOREIGN PATENT DOCUMENTS

| | | | |
|---|---|---|---|
| 0 303 061 | 2/1989 | European Pat. Off. | 21/28 |

OTHER PUBLICATIONS

Ali et al., "Chemical–polishing Polishing of Interlayer Dielectric: A Review," pp. 63–68, Sep. 1994.

Sivaram et al. "Developments in Consumables Used in the CMP of dielectrics," pp. 166, Aug. 1995.

Wolf, "Silicon Processing for the VLSI era", vol. 2, pp. 189–191, 1990.

Wolf, *Silicon Processing for the VLSI Era vol. 2: Process Integration*, Lattice Press 1990, pp. 189–191.

Singer, "CMP Developers Take Aim at STI Applications" and "Slurry–Free CMP Reduces Dishing, Speeds Process," *Semiconductor International*, Feb. 1998, vol. 21, No. 2, p. 40.

*Primary Examiner*—Benjamin L. Utech
*Assistant Examiner*—Lan Vinh
*Attorney, Agent, or Firm*—Kevin L. Daffer; Conley, Rose & Taylon

[57] ABSTRACT

The present invention advantageously provides a method and apparatus for polishing a semiconductor topography by applying a liquid which is void of particles between the topography and an abrasive polishing pad surface. The semiconductor topography is rotated relative to the polishing surface to polish elevationally raised regions of the topography. The particles are fixed within the polishing surface which may comprise a polymeric material. In one embodiment, the liquid may comprise water diluted with acid. If the liquid is adjusted to have a pH between 6.0 and 7.0, the polishing process may be used to remove a silicon dioxide layer from the topography at a faster rate than a silicon nitride layer residing beneath the oxide layer. Alternately, a metal may be selectively removed from above an oxide layer if the polishing liquid has a pH between 2.0 and 5.0. In another embodiment, the liquid may be deionized water. The water does not react with the material being polished. The polishing pad is made of a non-deformable material, and thus does not conform to the elevationally disparate semiconductor topography. Therefore, elevationally raised regions of the topography are removed at a faster rate than elevationally recessed regions.

9 Claims, 7 Drawing Sheets

U.S. PATENT DOCUMENTS

| | | | |
|---|---|---|---|
| 4,778,532 | 10/1988 | McConnell et al. | 134/10 |
| 4,789,648 | 12/1988 | Chow et al. | 437/225 |
| 4,879,258 | 11/1989 | Fisher | 437/225 |
| 4,933,715 | 6/1990 | Yamada et al. | 355/53 |
| 4,944,836 | 7/1990 | Beyer et al. | 156/645 |
| 4,954,141 | 9/1990 | Takiyama et al. | 51/296 |
| 4,962,423 | 10/1990 | Yamada et al. | 358/101 |
| 4,968,381 | 11/1990 | Prigge et al. | 156/636 |
| 4,986,878 | 1/1991 | Malazgirt et al. | 156/643 |
| 5,032,203 | 7/1991 | Doy et al. | 156/345 |
| 5,057,462 | 10/1991 | Eisenberg et al. | 437/229 |
| 5,064,683 | 11/1991 | Poon et al. | 427/39 |
| 5,084,419 | 1/1992 | Sakao | 437/228 |
| 5,209,816 | 5/1993 | Yu et al. | 156/636 |
| 5,273,558 | 12/1993 | Nelson et al. | 51/298 |
| 5,288,333 | 2/1994 | Tanaka et al. | 134/31 |
| 5,320,706 | 6/1994 | Blackwell | 156/636 |
| 5,320,978 | 6/1994 | Hsu | 437/192 |
| 5,340,370 | 8/1994 | Cadien et al. | 51/308 |
| 5,346,584 | 9/1994 | Nasr et al. | 156/636 |
| 5,362,668 | 11/1994 | Tasaka | 437/67 |
| 5,362,669 | 11/1994 | Boyd et al. | 437/67 |
| 5,363,550 | 11/1994 | Aitken et al. | 29/828 |
| 5,376,482 | 12/1994 | Hwang et al. | 430/5 |
| 5,389,194 | 2/1995 | Rostoker et al. | 156/636 |
| 5,389,579 | 2/1995 | Wells | 437/225 |
| 5,392,361 | 2/1995 | Imaizumi et al. | 382/8 |
| 5,395,801 | 3/1995 | Doan et al. | 437/225 |
| 5,401,691 | 3/1995 | Caldwell | 437/228 |
| 5,406,111 | 4/1995 | Sun | 257/497 |
| 5,435,772 | 7/1995 | Yu | 451/63 |
| 5,436,488 | 7/1995 | Poon et al. | 257/397 |
| 5,441,094 | 8/1995 | Pasch | 156/636.1 |
| 5,459,096 | 10/1995 | Venkatesan et al. | 437/67 |
| 5,468,983 | 11/1995 | Hirase et al. | 257/344 |
| 5,486,265 | 1/1996 | Salugsugan | 156/636.1 |
| 5,492,858 | 2/1996 | Bose et al. | 437/67 |
| 5,494,857 | 2/1996 | Cooperman et al. | 437/228 |
| 5,503,962 | 4/1996 | Caldwell | 430/317 |
| 5,525,840 | 6/1996 | Tominaga | 257/797 |
| 5,531,861 | 7/1996 | Yu et al. | 156/636.1 |
| 5,541,427 | 7/1996 | Chappell et al. | 257/306 |
| 5,551,986 | 9/1996 | Jain | 134/6 |
| 5,573,633 | 11/1996 | Gambino et al. | 156/636.1 |
| 5,578,523 | 11/1996 | Fiordalice et al. | 437/190 |
| 5,591,239 | 1/1997 | Larson et al. | 51/294 |
| 5,595,937 | 1/1997 | Mikagi | 437/192 |
| 5,607,345 | 3/1997 | Barry et al. | 451/539 |
| 5,616,513 | 4/1997 | Shepard | 438/402 |
| 5,629,242 | 5/1997 | Nagashima et al. | 438/692 |
| 5,643,406 | 7/1997 | Shimomura et al. | 156/636.1 |
| 5,643,823 | 7/1997 | Ho et al. | 437/67 |
| 5,643,836 | 7/1997 | Meister et al. | 438/228 |
| 5,652,176 | 7/1997 | Maniar et al. | 437/67 |
| 5,656,097 | 8/1997 | Olesen et al. | 134/1 |
| 5,664,990 | 9/1997 | Adams et al. | 451/60 |
| 5,665,202 | 9/1997 | Subramanian et al. | 438/692 |
| 5,666,985 | 9/1997 | Smith, Jr. et al. | 134/142 |
| 5,702,977 | 12/1997 | Jang et al. | 437/67 |
| 5,728,308 | 3/1998 | Muroyama | 216/88 |
| 5,776,808 | 7/1998 | Muller et al. | 438/243 |
| 5,837,612 | 11/1998 | Ajuria et al. | 438/697 |
| 5,906,532 | 5/1999 | Nakajima et al. | 451/41 |
| 5,919,082 | 7/1999 | Walker et al. | 451/41 |
| 5,952,687 | 9/1999 | Kawakubo et al. | 257/296 |
| 6,010,964 | 1/2000 | Glass | 438/692 |

EMPLOYING DEIONIZED WATER AND AN ABRASIVE SURFACE TO POLISH A SEMICONDUCTOR TOPOGRAPHY

RELATED APPLICATION

This application is related to a co-pending U.S. Patent Application to Sethuraman et al. entitled "Employing An Acidic Liquid And An Abrasive Surface To Polish A Semiconductor Topography" which is incorporated as if fully set forth herein.

BACKGROUND OF THE INVENTION

1. Field of the Invention

This invention relates to integrated circuit manufacturing, and more particularly, to a method and system for polishing a semiconductor topography in which deionized water substantially free of particulate matter is applied between the semiconductor topography and a surface entrained with abrasive particles.

2. Description of the Related Art

Fabrication of a multi-level integrated circuit involves numerous processing steps. After impurity regions have been formed within a semiconductor substrate and gate areas defined upon the substrate, interconnect routing is placed across the semiconductor topography and connected to the impurity regions. An interlevel dielectric is formed between the interconnect routing and the substrate to isolate the two levels. Contact areas are placed through the dielectric to electrically link the interconnect routing to select impurity regions extending across the substrate. A second level of interconnect routing may be placed across a second level of interlevel dielectric arranged above the first level of interconnect routing. The first and second levels of interconnect routing may be coupled together by contact structures arranged through the second level of interlevel dielectric. Additional levels of interconnect routing and interlevel dielectric may be formed, if desired.

Unfortunately, unwanted surface irregularities (i.e., elevation disparities) occur across the topological surface prior to and after forming a multi-level interconnect structure. For example, a recess may form in the surface of a semiconductor topography during the formation of trench isolation structures within, e.g., a silicon-based substrate. The trench isolation process involves etching a trench within the substrate, followed by chemical-vapor deposition ("CVD") of a dielectric material into the trench and across the substrate to a level spaced above an upper surface of the substrate. Since the dielectric material accumulates at the same rate upon the base of the trench as well as upon the substrate upper surface laterally outside the trench, a recess will occur in the upper surface of the dielectric material above the trench area. If left unattended, such elevational disparities in the surface of a dielectric layer can lead to various problems. For example, when an interconnect layer is placed across a dielectric surface having elevationally raised and recessed regions, step coverage problems may result. Step coverage is defined as a measure of how well a film conforms over an underlying step and is expressed by the ratio of the minimum thickness of a film as it crosses a step to the nominal thickness of the film on horizontal regions. Another problem resulting from elevational disparity occurs when subsequent layers are lithographically patterned from the deposited layer. Demarcation between polymerized or non-polymerized photoresist will skew in a lateral dimension as a result of a change in depth-of-focus depending on whether the photoresist resides in an elevational "hill" or "valley" area.

The concept of utilizing chemical and mechanical abrasion to planarize and remove surface irregularities of a topological surface is well known in industry as chemical-mechanical polishing ("CMP"). As shown in FIG. 1, a typical CMP process involves placing a semiconductor wafer 12 face-down on a polishing pad 14 which is fixedly attached to a rotatable table or platen 16. Elevationally extending features of semiconductor wafer 12 are positioned such that they contact the slurry attributed to the CMP process. The polishing pad may be made of various substances, depending on the material being polished. A popular polishing pad medium comprises polyurethane or polyurethane-impregnated polyester felts. An example of a somewhat hard polishing pad is the IC-1000 type pad commercially available from Rodel Products Corporation. A relatively soft pad is the SUBA 500 type pad, also manufactured by Rodel Products Corporation. During the CMP process, polishing pad 14 and semiconductor wafer 12 may be rotated while a carrier 10 holding wafer 12 applies a downward force F upon polishing pad 14. An abrasive, fluid-based chemical, often referred to as a "slurry", is deposited upon the surface of polishing pad 14 via a conduit 18 positioned typically above the pad. In this manner, the slurry occupies an interface between pad 14 and the surface of wafer 12. The slurry initiates the polishing process by chemically reacting with the surface material being polished. The rotational movement of polishing pad 14 relative to wafer 12 causes abrasive particles entrained within the slurry to physically strip the reacted surface material from wafer 12. The abrasive slurry particles are typically composed of silica, alumina, or ceria. A polishing apparatus for polishing hard and fragile materials is described in U.S. Pat. No. 5,032,203, which is incorporated herein by reference.

Delivery of the slurry must be carefully monitored so as not to unduly accumulate in select regions of the topography. If too much slurry accumulates in a relatively small area, that area may scratch or, in the extreme, polish at an unacceptably high polish rate. A post-CMP cleaning step is required to remove residual slurry particles from the surface of the polished topography. Without adequately removing the slurry, abrasive slurry particles will remain on the semiconductor topography and contaminate that surface. Considering the minute dimensions of integrated circuit topological features, even the tiniest of defect in the semiconductor topography can render the ensuing integrated circuit inoperable. U.S. Pat. No. 5,320,706 (incorporated herein by reference) describes a method for removing slurry particle residue from a wafer surface by polishing the wafer with a pad while a mixture of deionized water and a surfactant is applied to the wafer and pad. Unfortunately, the removal of such slurry particles may be time consuming and costly. Further, some types of cleaning procedures can be detrimental to the semiconductor topography. The slurry waste must also be disposed of and subjected to waste treatment after planarization is complete because of the toxic nature of some of the effluent components. The disposal and waste treatment of the slurry effluent significantly increases the cost of manufacturing the integrated circuit. Various problems associated with CMP are described in "Chemical-mechanical polishing of interlayer dielectric: A review", Ali et al., *Solid Slale Technology*, October 1994, pp. 63–68 (incorporated herein by reference).

FIGS. 2, 3 and 4 illustrate the formation of a trench isolation structure within a semiconductor substrate, according to a conventional technique. As shown in FIG. 2, a semiconductor substrate 20 comprising, e.g., lightly doped single crystalline silicon is provided. A silicon nitride ("nitride") layer 24 is arranged across the upper surface of substrate 20. A "pad" oxide layer 22 may be interposed between substrate 20 and nitride layer 24 to reduce inherent stresses between nitride and silicon. As shown, portions of nitride layer 24 and substrate 20 are etched away to define a trench 21 within substrate 20. Turning to FIG. 3, a fill oxide 26 is then CVD deposited into trench 21 to a level spaced above the upper surface of nitride layer 24. Prior to depositing fill oxide 26, a thermally grown oxide liner may be formed at the periphery of trench 21 while nitride layer 24 protects the upper surface of substrate 20 from being oxidized. The resulting upper surface of fill oxide 26 includes a recess 27 arranged above the trench area. A CMP step is then performed to planarize the surface of the semiconductor topography.

As shown in FIG. 4, CMP is applied to the topography of FIG. 3 to remove the topological surface down to a level 28b spaced below the original upper surface 28a of substrate 20. The chemical slurry used to polish the topological surface reacts and therefore removes oxide at a higher rate than nitride. Accordingly, fill oxide 26 is removed to an elevation level below nitride layer 24. It may be difficult to determine the exact amount of time required to remove the upper surface of fill oxide 26 down to a level coplanar with the upper surface of nitride layer 24. Unfortunately, removal of nitride may contaminate the substrate "active areas" beneath nitride layer 24. Ensuing impurity regions implanted into the active regions may not receive an optimal dosage and/or implant profile. In an extreme, implant regions may extend below the base of the fill oxide or above the surface of the fill oxide. In the former instance, current may leak between isolated junction, and in the latter instance, the exposed corners of the junctions may suffer unreasonably low breakdown voltages. Further, a lowered active area resulting from excessive CMP may cause the active area to no longer be a pristine crystalline lattice and thus may include dangling bonds and an irregular grain structure which can provide opportune bond sites and migration pathways to foreign atoms during later processing steps.

The topological surface of fill oxide 26 contains an elevationally recessed region 30 and is not planar in large lateral-area trenches. The slurry chemistry may have contributed to the non-planarity of the surface of fill oxide 26. During the CMP process, the slurry, being a relatively viscous fluid, may have flowed to the elevationally recessed region of the topological surface of fill oxide 26. The slurry thusly placed may have reacted with the surface material at the elevationally recessed region, releasing the surface material from its union with the bulk of fill oxide 26. Further, the polishing pad, being somewhat conformal to the topological surface, may have deformed to the elevationally raised and recessed topography by "bowing" in an arcuate pattern in response to a force being applied thereto. Therefore, deformation in polishing pad planarity may have also contributed to the formation of elevationally recessed region 30 by physically stripping the reacted surface material of fill oxide 26 from the semiconductor topography. Thus, while the removal rate of elevationally raised regions of the semiconductor may have been greater than that of the elevationally recessed region, a significant amount of the elevationally recessed region has, unfortunately, also been removed.

It would therefore be desirable to develop a process for polishing a semiconductor topography without being concerned with unwanted removal of elevationally recessed regions of the material being polished. As such, it is necessary to prevent the CMP polishing fluid from reacting with the elevationally recessed regions of the semiconductor topography. Further, using a substantially rigid polishing pad that does not significantly deform when subjected to pressure would provide for reduced removal of the elevationally recessed regions. A planarization process which selectively removes raised areas faster than recessed areas of the same material, or one material in lieu of another material would also be beneficial. The desired planarization process could be applied to global planarization of an elevationally disparate dielectric or conductive surface, or selective planarization of a dielectric in a trench isolation process or a conductor in a contact-fill (or "plug") process. In instances where a trench isolation structure is to be formed, removal of substrate active areas beneath the nitride layer would be substantially eliminated at times when the fill oxide is being planarized. It would also be beneficial to devise a polish process that does not require the costly removal and treatment of slurry waste. Further, a CMP and/or polish process is needed in which there is less risk of the semiconductor topography being damaged or contaminated by abrasive slurry particles during and/or following CMP.

SUMMARY OF THE INVENTION

The problems outlined above are in large part solved by the planarization technique hereof The present invention advantageously provides a method for polishing a semiconductor topography by placing a liquid which is substantially free of particulate matter between the semiconductor topography and an abrasive surface in which particles are fixed therein. The abrasive surface is moved relative to the semiconductor topography so as to remove elevationally raised regions faster than elevationally recessed regions of the topography. Absent the use of a slurry, no slurry waste stream is generated during the planarization process. Accordingly, the cost and loss of time incurred to dispose of a slurry effluent is no longer a concern. Further, since the liquid applied to the polishing surface is void of particulate matter, it is less probable that abrasive particles will remain upon the semiconductor topography after the planarization process is completed. Particles extending from the abrasive surface, although attached to the surface, may become dislodged from the abrasive surface such that they come to rest upon the semiconductor topography. However, the quantity of the particles residing upon the semiconductor topography is expected to be relatively small. Thus, most of the particles can be easily removed from the semiconductor topography during a post-polish clean. Accordingly, fewer particles are available after the planarization process to damage or contaminate the surface of the semiconductor topography.

In one embodiment, an acidic liquid which is substantially free of particulate matter is applied between the semiconductor topography and an abrasive, polishing surface. The abrasive surface may be composed of a polymeric material having particles fixed within and partially into the polymeric material. The particles may be composed of, e.g., cerium oxide, cerium dioxide, $\alpha$ alumina ($\alpha$ aluminum oxide), $\gamma$ alumina ($\gamma$ aluminum oxide), silicon dioxide, titanium oxide, chromium oxide, or zirconium oxide. A polish selectivity of oxide to nitride which is greater than 20:1 may be achieved by adjusting the pH of the acidic liquid to be between approximately 6.0 and 7.0 prior to applying the liquid between the semiconductor topography and the polishing surface. An acid including, but not limited to nitric acid, sulfuric acid, acetic acid, hydrofluoric acid, and hydrochloric acid may be diluted slightly with water to achieve a desired pH value. Elevationally raised features of a semiconductor topography are positioned adjacent the abrasive surface. A force perpendicular to the abrasive surface is applied to the semiconductor topography while moving the abrasive surface relative to the topological surface. According to exemplary application, it is believed that the reaction rate between the acidic liquid and oxide is substantially greater than the reaction rate between the acidic liquid and nitride. Thus, when exposed to the acidic liquid, oxide may be transformed into a new compound which is readily dislodged from the semiconductor topography by the abrasive particles. As a result, an oxide layer may be polished at a substantially faster rate than a nitride layer residing beneath the oxide layer.

The polishing technique hereof is particularly applicable to removing one type of is material at a faster rate than another type of material. For example, the present polishing technical is useful in the formation of a trench isolation structure. A fill oxide deposited into a trench within a substrate to a level spaced above a nitride layer arranged upon the substrate may be planarized without significant removal of the underlying nitride layer. Advantageously, the nitride layer retained above the substrate surface prevents the underlying substrate from being polished, and thus damaged. Consequently, it is very improbable that impurity regions subsequently implanted into active areas of the substrate will extend below or above the trench isolation structure. As such, the trench isolation structure is capable of providing adequate isolation of the impurity regions and protection against current leakage and/or voltage breakdown. Moreover, since the substrate surface is protected from being polished, its grain structure is substantially regular. As such, very few migration pathways exist at the substrate surface through which foreign atoms can pass into the substrate. Therefore, detrimental foreign atoms are inhibited from being positioned within the ensuing impurity regions. Alternately, the pH of the acidic liquid applied to the polishing surface may range from approximately 2.0 to 5.0 to allow for the removal of a metal layer at a faster rate than a dielectric layer positioned underneath the metal layer. The acidic liquid may be used to planarize the surface of a metal, such as aluminum, deposited into an opening which extends through an interlevel dielectric, such as oxide. Such a technique may be performed to produce an aluminum plug exclusively within a contact opening between levels of interconnect. Alternatively, the aluminum material can be limited to a trench within the interlevel dielectric to comprise a trace conductor in accordance with the well-known damascene process.

In another embodiment, deionized water which is substantially free of particulate matter may be applied between the semiconductor topography and an abrasive, polishing surface. In this embodiment, the pH of the deionized water is maintained at a neutral value (i.e., non-acidic and non-alkaline) of approximately 7.0. The polishing surface may be made of a polymeric material in which abrasive particles extend therefrom. An example of the types of materials that the abrasive particles may be composed of is similar to those used with an acidic pH solution. The polishing surface may be moved relative to the semiconductor topography to remove immediately adjacent material from the semiconductor topography. The presence of deionized water allows the polishing surface to more smoothly glide across the semiconductor topography, wearing away elevationally raised regions of the topography. Although the deionized water may come in contact with the elevationally recessed regions of the semiconductor topography, no reaction occurs between the deionized water and the underlying surface material. Further, the polishing pad is substantially rigid and does not significantly deform into relatively large trench areas about the length of the pad when undergoing normal pressure. The present pad withstands deformation even when placed across an elevationally recessed region of relatively large lateral dimension (e.g., over 200 microns lateral dimension). Therefore, the pad does not conform to an underlying surface and does not come in contact with elevationally recessed regions of the semiconductor topography. As such, elevationally raised regions of the semiconductor topography are removed at a faster rate than elevationally recessed regions, and global planarization over relatively large areas may be accomplished. Furthermore, the removal rate of the elevationally raised regions is greater than that of the semiconductor topography once the elevationally raised regions have been removed down to the elevationally recessed regions.

As opposed to the first embodiment, the second embodiment is particularly useful when polishing elevationally disparate surfaces of a single type material. The material can be either a dielectric or a conductor. Raised regions of the dielectric layer (e.g., oxide) are removed faster than recessed regions of the dielectric. Alternatively, raised regions of the conductor layer are 1o removed faster than recessed regions of the conductor. A beneficial application involves removing raised regions of an oxide layer which has been deposited across a semiconductor topography having trenches formed therein. The second embodiment may also be used to polish an elevationally raised region of one material down to a recessed region of another material. Since the removal rate significantly decreases after the topological surface is planarized, the second embodiment may provide high polish selectivity between dissimilar materials having surfaces that reside at different elevational levels.

BRIEF DESCRIPTION OF THE DRAWINGS

Other objects and advantages of the invention will become apparent upon reading the following detailed description and upon reference to the accompanying drawings in which.

Figure 1:
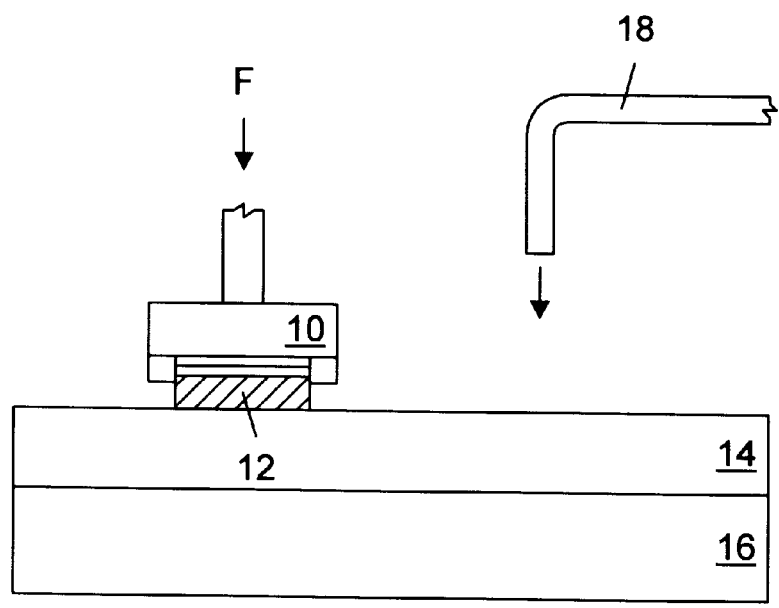
FIG. 1 is a side plan view of an apparatus that may be used to chemical-mechanical polish a semiconductor topography.
Figure 2:
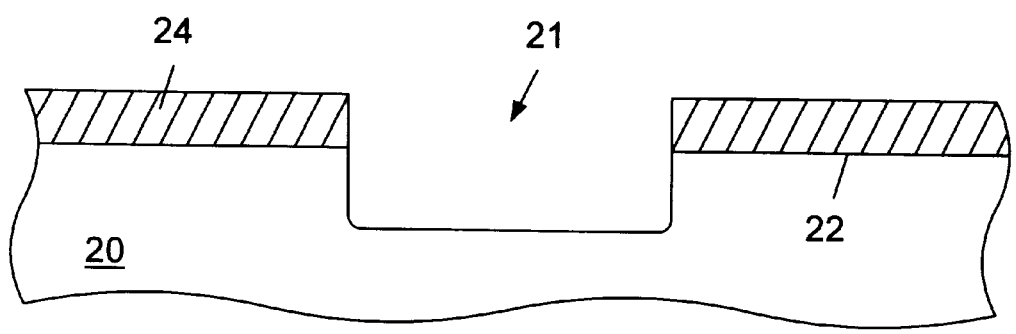
FIG. 2 is a partial cross-sectional view of a semiconductor topography, wherein a trench is formed within a semiconductor substrate upon which a nitride layer is arranged.
Figure 3:
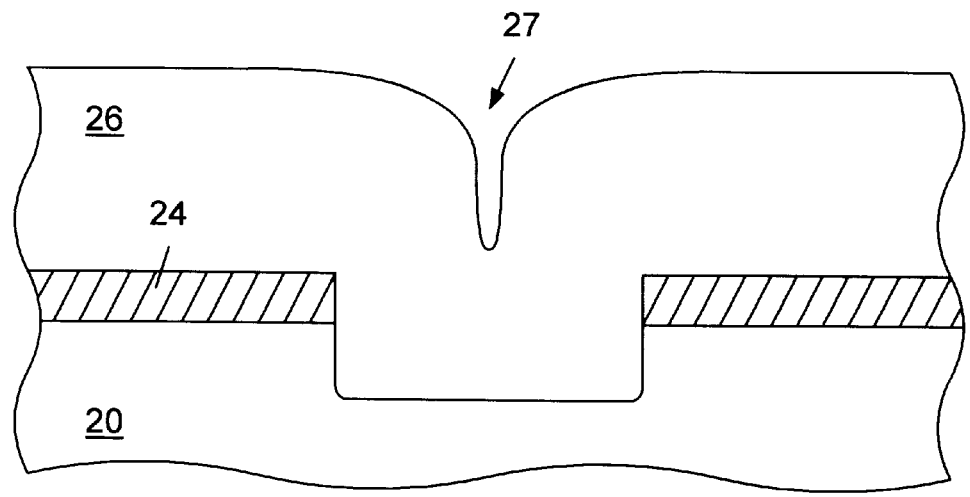
FIG. 3 is a partial cross-sectional view of the semiconductor topography, wherein a fill oxide is deposited into the trench to a level spaced above the nitride layer such that a recess is formed within the upper surface of the fill oxide.
Figure 4:
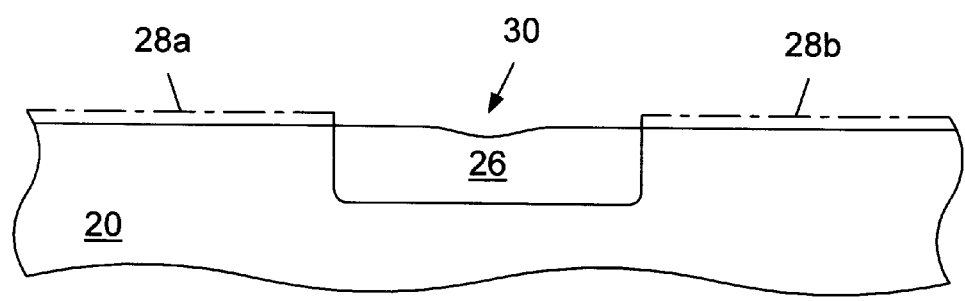
FIG. 4 is a partial cross-sectional view of the semiconductor topography, wherein the surface of the semiconductor topography is removed down to a level slightly spaced below the original upper surface of the substrate using a conventional CMP technique.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 5:
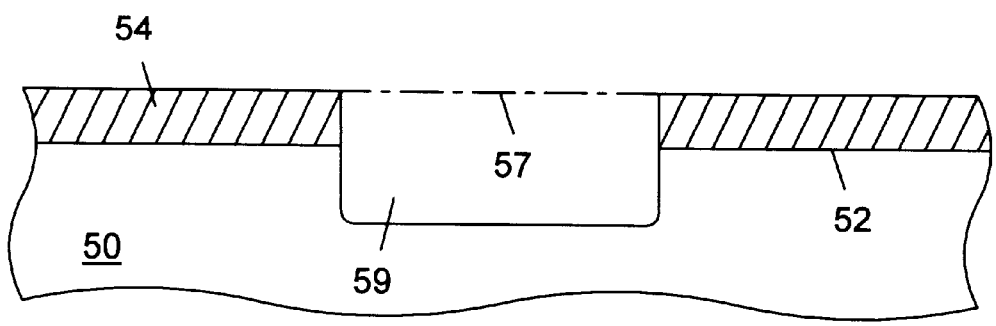
FIG. 5 is a partial cross-sectional view of a semiconductor topography, wherein a trench is formed within a semiconductor substrate upon which a nitride layer resides.
Figure 6:
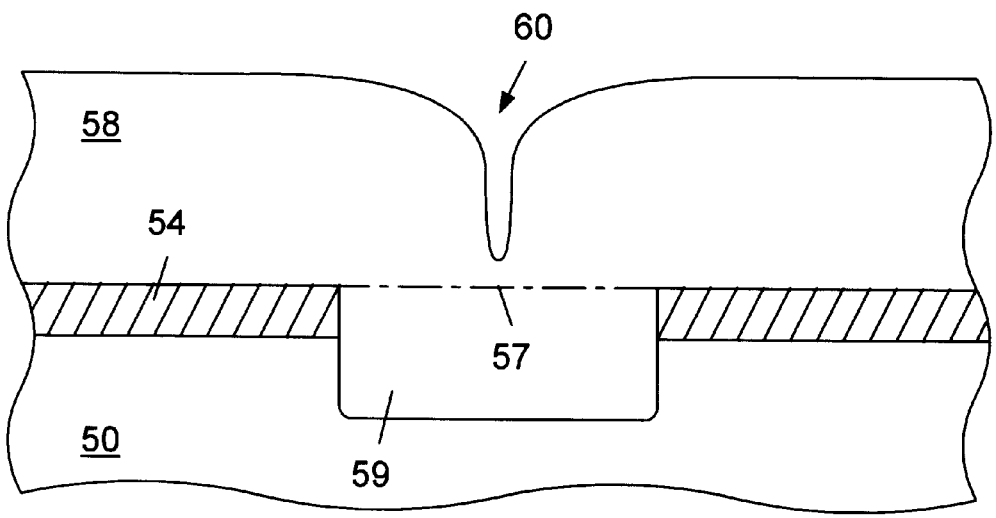
FIG. 6 is a partial cross-sectional view of the semiconductor topography, wherein a fill oxide is deposited into the trench to a level spaced above the nitride layer such that a recess is formed within the upper surface of the fill oxide.
Figure 7:
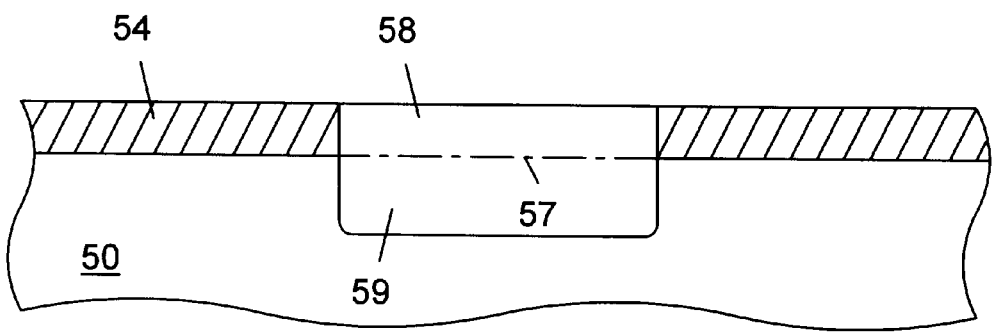
FIG. 7 is a partial cross-sectional view of the semiconductor topography, wherein the surface of the semiconductor topography is removed down to a level substantially commensurate with the upper surface of the nitride layer using a planarization process according to an embodiment of the present invention.

FIGS. 5–7 depict planarization of one type of material relative to another material, according to one embodiment of the present invention. It is to be understood that an embodiment of the present invention may be applied to other processing steps besides the ones illustrated in FIGS. 5–7.

Turning to FIG. 5, a partial cross-sectional view of a semiconductor substrate 50 and/or topography is depicted. Substrate 50 may comprise single crystalline silicon slightly doped with n-type or p-type impurities. A nitride layer 54 is arranged upon semiconductor substrate 50. Nitride layer 54 may be CVD deposited across oxide layer 52. The nitride deposition may be performed using, e.g., a horizontal tube LPCVD reactor provided with a silane- and ammonia-containing gas. An oxide layer 52 may be interposed between nitride layer 54 and substrate 50. Oxide layer 52 may either be thermally grown or CVD deposited from, e.g., a silane and oxygen bearing gas upon substrate 50. Oxide layer 52 serves as a "pad oxide" to reduce inherent stresses between nitride layer 54 and substrate 50.

Portions of nitride layer 54, oxide layer 52, and substrate 50 have been etched away to form a relatively shallow trench 59 to a depth spaced below the upper surface of the substrate. A photoresist layer may be patterned above select portions of nitride layer 54 prior to the etch step using a well known optical lithography technique. Those portions of nitride layer 54, oxide layer 52, and substrate 50 not covered by the photoresist layer may be etched for a predetermined period of time using, e.g., a dry, plasma etch technique.

In lieu of forming a trench 59 within substrate 50, an impurity region can be selectively placed into substrate 50. The impurity region is denoted as numeral 59. Thus, depending on the process flow, region 59 can be either a trench formed within the substrate or a doped area formed within the substrate. Impurity region 59 is shown having an upper surface 57 commensurate with the surface of substrate 50. Impurity region 59 may comprise n-type or p-type dopants. If this is the case, an interlevel dielectric 54 composed of, e.g., oxide PECVD deposited from a tetraethyl orthosilicate (TEOS) source may be arranged across the entire surface of substrate 50, including the doped region 59. An opening may then be etched through interlevel dielectric to impurity region 59. The opening lateral dimension can vary and in most instances does not extend the length or width of region 59.

As shown in FIG. 6, a fill dielectric 58 may be CVD deposited into trench 59 to a level spaced above nitride layer 54. A recess 60 may result in the upper surface of fill oxide 58 above the trench region. Alternately, a metal 58, e.g., aluminum, may be deposited across impurity region surface 57 to a level spaced above interlevel dielectric 54, resulting in the formation of a recess 60 in the upper surface of metal 58. It should be noted that the dielectric or metal fill layers are not drawn to scale, nor are the various other layers which form an elevationally disparate upper surface.

Turning to FIG. 7, the upper surface of fill dielectric 58 or metal 58 may be removed down to a level substantially coplanar with the upper surface of nitride layer 54 or interlevel dielectric 54, respectively. A polishing process according to an embodiment of the present invention may be used to substantially planarize the upper surface of the semiconductor topography. An apparatus similar in some respects to that shown in FIG. 1 may be used for the polishing process. The apparatus in FIG. 1 is purposefully modified to accommodate an abrasive polishing surface, wherein the conduit delivers particle-free acidic or neutral solution.

Figure 11:
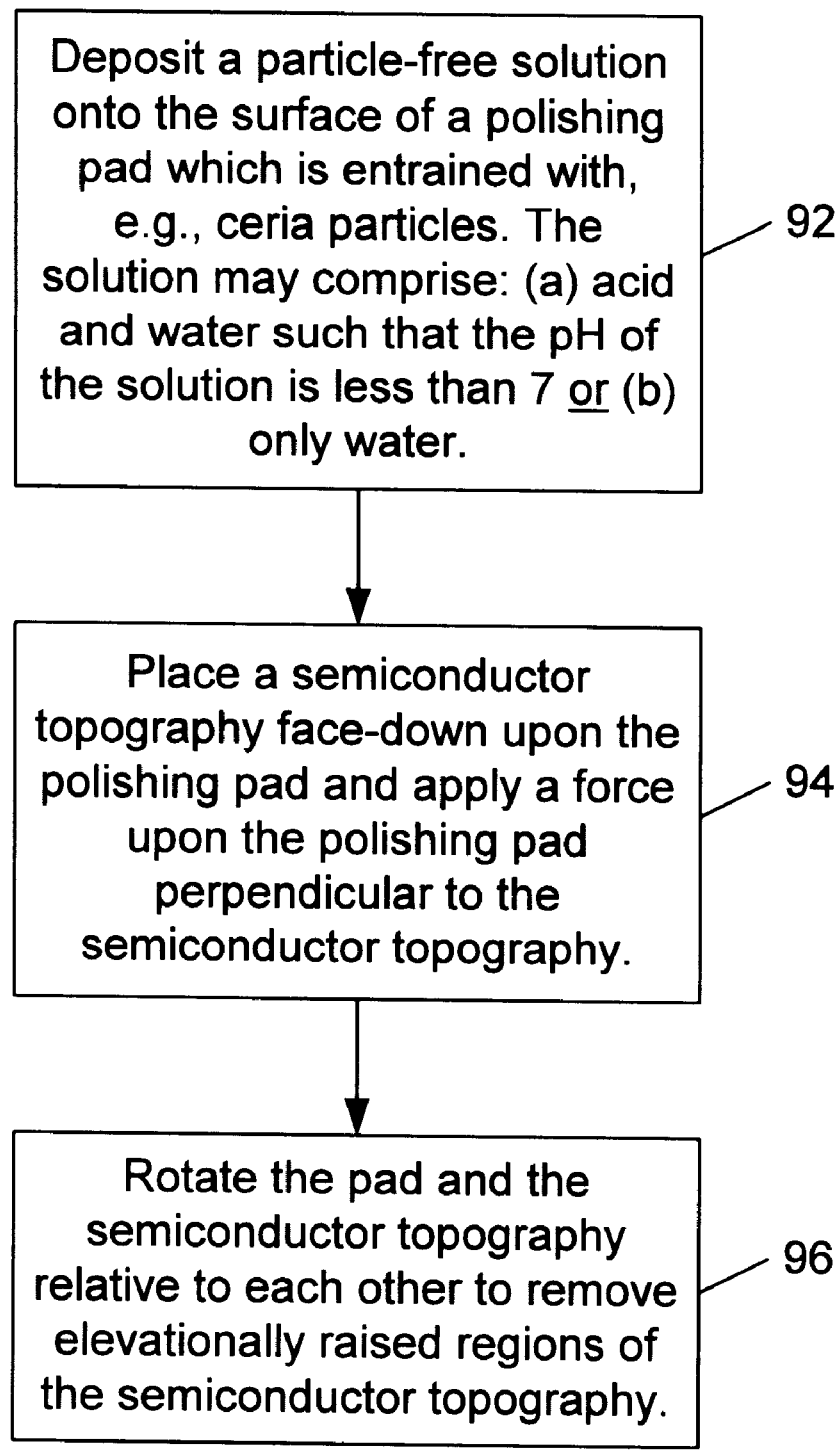
FIG. 11 is a process flow diagram of the steps performed during the planarization process of the present invention.

FIG. 11 is a process flow diagram of the polishing process. As described in block 92, an acidic solution of acid diluted with water may be dispensed onto a polishing surface of a polishing pad. The polishing surface is entrained with abrasive particles. Appropriate materials that may be used for the particles include, but are not limited to, ceria, oX alumina, y alumina, silicon dioxide, titania, chromia, and zirconia. Preferably, if fill material 58 is oxide, and oxide is to be polished down to nitride layer 54, the pH of the acidic solution is chosen between approximately 6.0 and 7.0. On the other hand, if fill material 58 is metal being polished down to interlevel dielectric 54, the pH of the acidic solution is between approximately 2.0 and 5.0. The pH of the acidic solution may be adjusted by diluting acids, such as nitric acid, sulfuric acid, acetic acid, hydrofluoric acid, and hydrochloric acid, with water.

As shown in block 94 of FIG. 11, the semiconductor topography being polished may be positioned face-down upon the polishing surface. A force substantially perpendicular to the backside of the semiconductor topography may then be applied upon the polishing pad, pressing the topography against the polishing pad. The acidic solution is positioned at the interface between the semiconductor topography and the polishing pad surface. As shown in block 96, the semiconductor topography and the polishing pad surface may then be rotated relative to each other to remove elevationally raised regions of the semiconductor topography. The polishing rate of fill oxide 58 or metal 58 is substantially greater than the underlying nitride layer 54 or interlevel dielectric 54, respectively. The selectivity of oxide to nitride is greater than 5:1 and preferably exceeds 20:1. It is believed that the acidic solution reacts with oxide at a faster rate than nitride and with metal at a faster rate than dielectrics, particularly oxide. The reacted surface material, having been released from bondage with underlying bulk material may be stripped from the semiconductor topography by the particles extending from the polishing pad surface. The particles have a sufficient hardness to dislodge the reacted surface material during abrasion of the surface material. Because the polishing rate of nitride layer 54 or interlevel dielectric 54 is relatively slow, substantial portions of the nitride layer or the interlevel dielectric are not removed before termination of the polishing step. Therefore, nitride or interlevel dielectric 54 advantageously protects the underlying substrate 50 from being scratched or contaminated. Fill oxide 58 may form a trench isolation structure within substrate 50. Alternately, metal 58, having been formed using a damascene technique, may serve as a conductive contact to impurity region 59.

Figure 8:
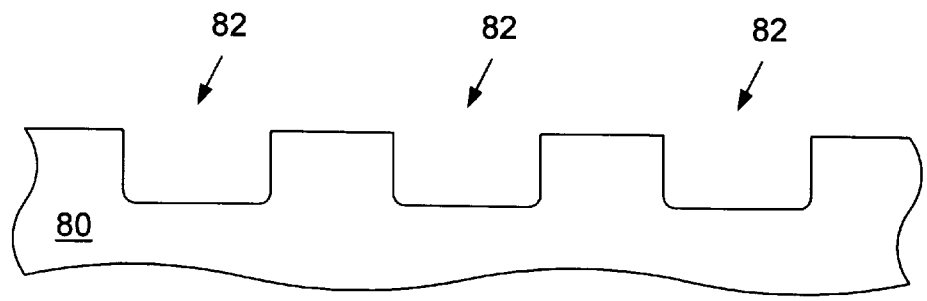
FIG. 8 is a partial cross-sectional view of the semiconductor topography in which trenches are arranged spaced distances apart within a substrate or dielectric topography.
Figure 9:
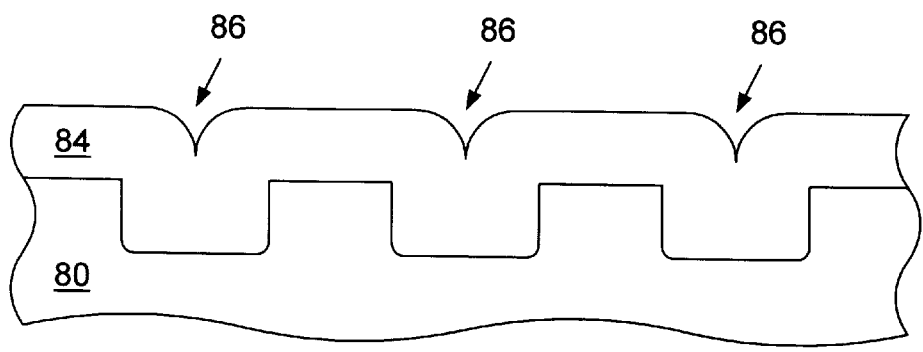
FIG. 9 is a partial cross-sectional view of the semiconductor topography, wherein a conductive or dielectric layer is deposited across the substrate and into the trench such that recesses are formed in the surface of the deposited layer above the trench regions.
Figure 10:
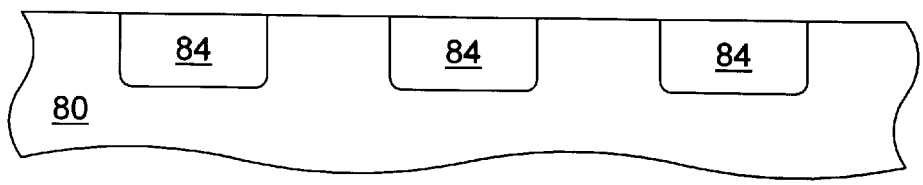
FIG. 10 is a partial cross-sectional view of the semiconductor topography, wherein an embodiment of the planarization process of the present invention is used to remove elevationally raised regions of the deposited layer at a faster rate than elevationally recessed regions, resulting in the upper surface of the deposited layer being substantially coplanar with the surface of the substrate or dielectric topography.

FIGS. 8–10 illustrate another embodiment of the present invention being used to remove elevationally raised regions of the semiconductor topography faster than elevationally recessed regions. It is to be understood that an embodiment of the present invention may be applied to other processing steps other than the ones illustrated in FIGS. 8–10. A semiconductor substrate 80 is shown in FIG. 8 as having trenches 82 etched therein. Trenches 82 are laterally spaced apart across substrate 80. FIG. 9 depicts the deposition of a dielectric material 84 into trenches 82 and across substrate 80. Dielectric material 84 may include, e.g., spin-on-glass (SOG), doped or undoped glass, or oxide. The resulting upper surface of dielectric material 84 is displaced above the upper surface of substrate 80 and includes recesses 86 above the trench regions. As such, dielectric material 84 may comprise elevationally raised regions spaced above elevationally recessed regions. A polishing technique according to the step in FIG. 11 may then be performed upon the upper surface of dielectric material 84. A modified apparatus depicted in FIG. 1 may be used for the polishing process. As shown in block 92 of FIG. 11, deionized water which is substantially free of particulate matter may be deposited upon an abrasive, polishing pad surface during the polishing process shown in FIG. 10. The deionized water has a neutral pH of approximately 7.0. Particles are fixed into the pad material to provide abrasion. As described in block 94, the semiconductor topography may be placed faced-down upon the polishing pad surface such that the deionized water is interposed between the polishing surface and the semiconductor topography. The semiconductor topography may then be forced against the polishing pad surface while the polishing pad surface and the topography are being rotated relative to one another, as depicted in block 96.

During the polishing process, the deionized water is substantially inert and thus does not react with dielectric material 84. The polishing pad may include a supportive backing composed of a substantially rigid material, e.g., a thermosetting polymer. As such, the polishing pad does not significantly deform and contact recesses 86 during the polishing process. The polishing pad deforms less than 10 angstroms in relatively large trench areas, i.e., trench areas having greater than 200 microns lateral dimension. Therefore, since the polishing pad does not contact recesses 86 and the deionized water does not react with dielectric material 84, the removal rate of the elevationally recessed regions is substantially zero. Friction between the particles extending from the polishing pad surface and the elevationally raised regions of the semiconductor topography leads to the removal of those regions. It is believed that the deionized water allows the polishing surface to glide more smoothly across the semiconductor topography, and thereby provides for more uniform abrasion of the elevationally raised regions of the semiconductor topography. Further, the deionized water may help protect the semiconductor topography from being scratched by the particles. The removal rate of elevationally raised regions of dielectric material 84 is substantially greater than that of elevationally recessed regions. Hence, as shown in FIG. 10, the upper surface of dielectric material 84 may be polished to a level which is less than 10 angstroms below the upper surface of substrate 80. The planarization process hereof thus provides for global planarization of a semiconductor topography. Materials other than dielectric material 84 may also be polished according to an embodiment of the presently claimed invention. For example, material 84 may comprise a conductive material placed in trenches or contact openings formed within a dielectric. The conductive material include, for example, aluminum, copper, titanium, tantalum, tungsten, etc.

Figures 12A, 12B:
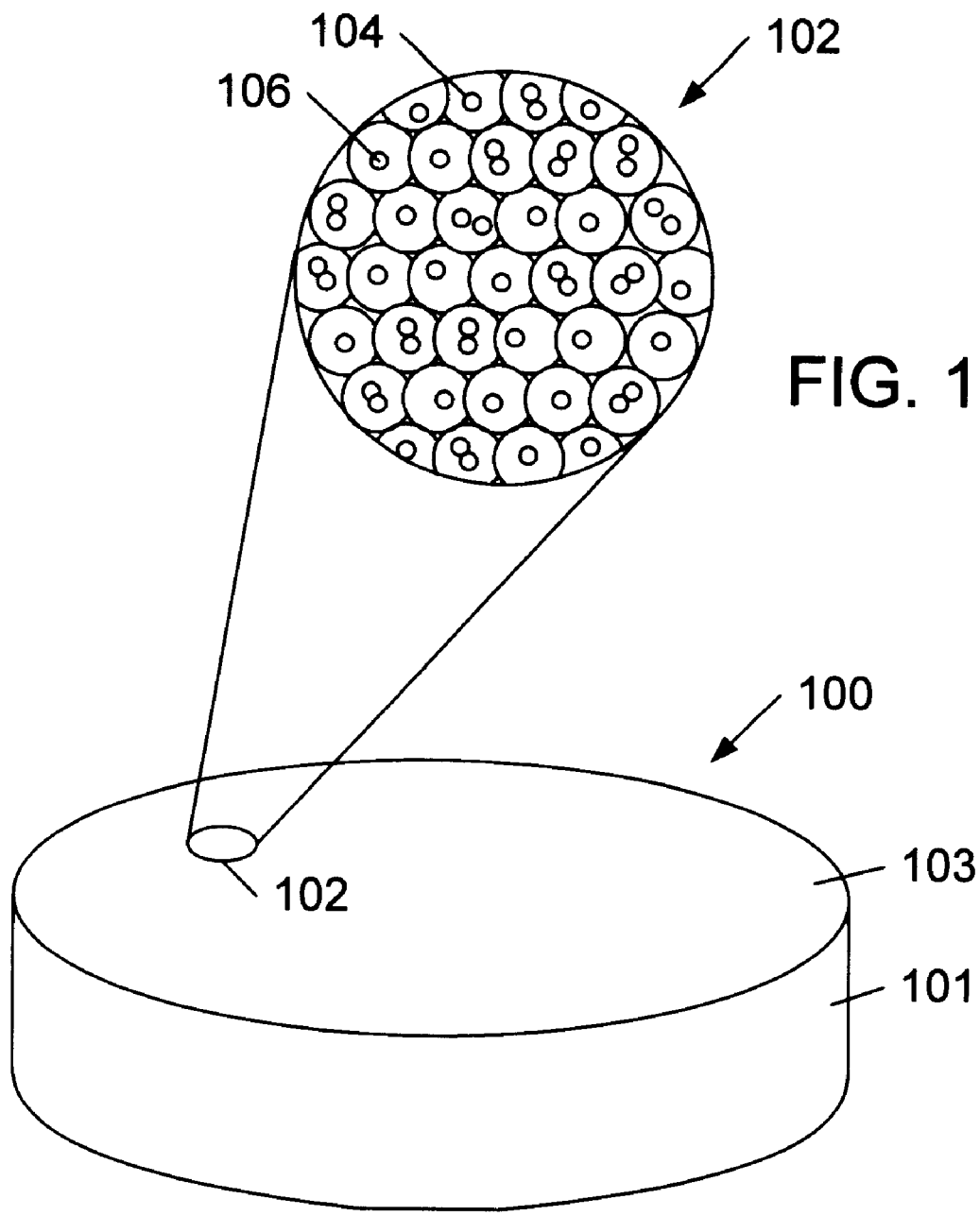
FIG. 12a is a perspective view of an abrasive polishing pad used for planarizing a topological surface.
FIG. 12b is a detailed view along section 102 of FIG. 12a showing abrasive particles spaced throughout a polymeric material of the polishing pad.

Turning to FIG. 12*a*, a polishing pad 100 which may be used to polish a semiconductor topography is depicted. While polishing pad 100 is shown as being cylindrical, it is not limited to this shape. Polishing pad 100 includes a substantially rigid supportive backing 101 and an abrasive polishing surface 103. FIG. 12*b* illustrates a detailed view along section 102 of polishing surface 103. As shown, polishing surface 103 may include a polymeric matrix 104. Polymeric matrix 104 may comprise, e.g., polyamide fibers which are interentangled randomly and having abrasive particles 106 attached to the fibers. U.S. Pat. No. 5,591,239 (incorporated herein by reference) describes a low-density abrasive article. Particles 106 may be spaced across polymeric matrix 104.

Figure 13:
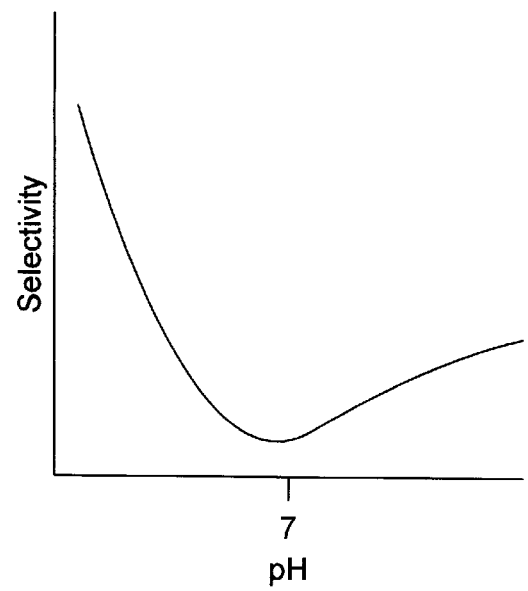
FIG. 13 is a plot of polishing selectivity as a function of the pH of the particle-free liquid applied to the polishing pad during the polishing process.

FIG. 13 is a plot of polish selectivity of oxide to nitride as a function of the pH of a particle-free liquid used for polishing a semiconductor topography. The oxide-to-nitride selectivity slowly increases and then begins to level off as the pH of the liquid increases from 7.0 to 14.0. The selectivity of oxide-to-nitride also increases at a rapid rate as the pH of the liquid decreases from 7.0 to 1.0. The selectivity is at a minimum when the pH of the polishing liquid is neutral. As the pH of the liquid decreases from 7.0 to 1.0, the polish rates of both oxide and nitride decreases. However, the rate of decrease in the polish rate of nitride is much faster than that of oxide. Eventually the polish rate of nitride becomes virtually zero. Although achieving the best selectivity of oxide-to-nitride requires decreasing the pH of the polishing liquid to a low value, decreasing the pH to below 6.0 may result in a significant decrease in the oxide polish rate. Thus, to achieve high selectivity of oxide-to-nitride while maintaining a sufficient polish throughput, it is desired to use a polishing liquid having a pH between 6.0 and 7.0. A similar trend may be observed when the polish selectivity of metal-to-oxide is plotted as a function of the pH of the polishing liquid. The optimum pH in this case is between 2.0 and 5.0.

Figure 14:
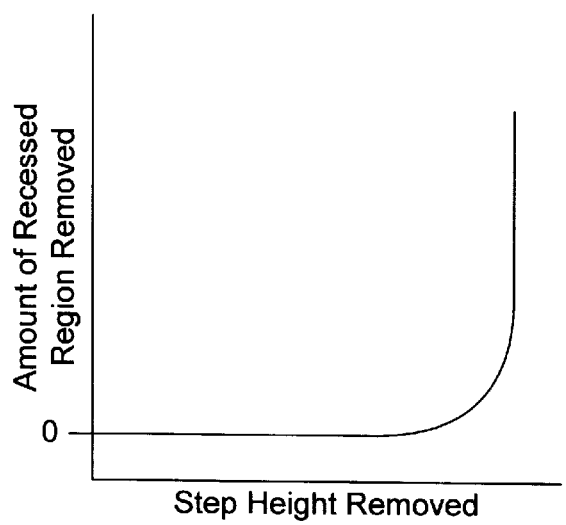
FIG. 14 is a plot of the amount of a recessed region removed as a function of the step height removed during polishing of a topological surface.
Figure 15:
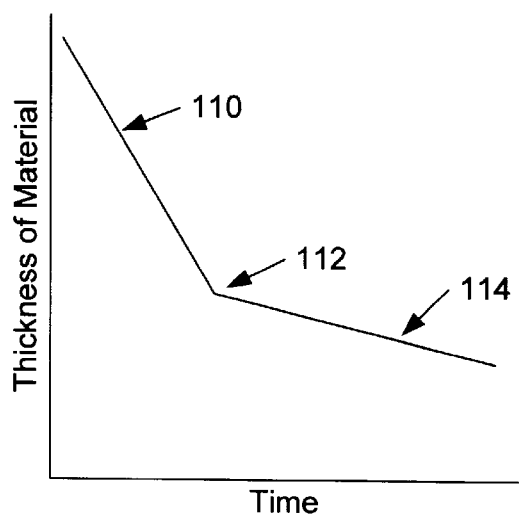
FIG. 15 is a plot of the thickness of the material as a function of polishing time.

FIG. 14 is a plot of the amount of an elevationally recessed region (or valley) removed as a function of the step height removed when a semiconductor topography is polished with a rigid polishing surface having particle-free, deionized water deposited thereon. The step height is the distance between the elevationally recessed region (or valley) and an elevationally raised region of the semiconductor topography spaced above the elevationally recessed region. The polishing pad communicates with the uppermost region of the semiconductor topography during polishing. Thus, the elevationally raised region is initially polished while the elevationally recessed region is initially unaltered. As the polishing progresses and more of the elevationally recessed region is removed, the step height decreases. As the step height continues to be removed, none of the recessed region is removed as indicated by the horizontal portion of the plotted curve. Eventually, the elevationally raised region is removed down to the elevationally recessed region, forming a substantially planar surface with no step height remaining to remove. At this point, the amount of recessed region (now the planar surface) removed rises sharply. FIG. 15 is a plot of the thickness of the material being removed versus time of polishing. As the elevationally raised region of a material is polished, the thickness of the material initially decreases rapidly as indicated by region 110 of the plotted curve. Then, after the elevationally raised region has been removed down to the elevationally recessed region, the thickness of the material continues to decrease but at a slower rate as indicated by region 114 of the plotted curve. Region 112 of the plotted curve indicates the transition period from when the surface of the material includes elevational disparity to when the surface is substantially planar. The slope of region 110 is greater than that of region 114 which demonstrates that the removal rate of the material significantly decreases once the previously elevated and recessed regions are at the same elevation.

It will be appreciated to those skilled in the art having the benefit of this disclosure that this invention is believed to provide a method and system for polishing a semiconductor topography by applying a liquid which is substantially free of particulate matter between the topography and an abrasive polishing surface. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for polishing a semiconductor topography, comprising applying a fluid that includes deionized water substantially free of particulate matter and having a pH from 2.0 to approximately 7.0 between the semiconductor topography and an abrasive polishing surface.

2. The method of claim 1, wherein the fluid that includes deionized water has an approximately neutral pH.

3. The method of claim 1, further comprising fixing particles partially into a polymer-based polishing surface.

4. The method of claim 3, wherein the particles comprise a material selected from the group consisting of cerium oxide, cerium dioxide, aluminum oxide, silicon dioxide, titanium oxide, chromium oxide, and zirconium oxide.

5. The method of claim 1, further comprising moving the polishing surface relative to the semiconductor topography to remove elevationally raised regions faster than elevationally recessed regions of the semiconductor topography.

6. The method of claim 1, further comprising moving the polishing surface relative to the semiconductor topography to remove elevationally raised regions of a dielectric layer at least twenty times faster than elevationally recessed regions of the dielectric layer.

7. The method of claim 6, wherein the dielectric layer comprises oxide.

8. The method of claim 1, further comprising moving the polishing surface relative to the semiconductor topography to remove elevationally raised regions of a conductive layer at least twenty times faster than elevationally recessed regions of the conductive layer.

9. The method of claim 8, wherein the conductive layer is selected from the group consisting of aluminum, copper, titanium and tantalum.

* * * * *

UNITED STATES PATENT AND TRADEMARK OFFICE
CERTIFICATE OF CORRECTION

PATENT NO. : 6,143,663  
DATED : November 7, 2000  
INVENTOR(S) : Koutny, Jr.

Page 1 of 1

It is certified that error appears in the above-identified patent and that said Letters Patent is hereby corrected as shown below:

<u>Title page,</u>
Item [75] Inventor: please add -- Anantha R. Sethuraman, Palo Alto, Calif. --

Signed and Sealed this

Eighteenth Day of December, 2001

Attest:

Attesting Officer

JAMES E. ROGAN  
*Director of the United States Patent and Trademark Office*